United States Patent [19]

Yoshida et al.

[11] 4,134,769

[45] Jan. 16, 1979

[54] OFFSET PRINTING PLATE

[75] Inventors: Akio Yoshida; Akira Tanaka; Yasuo Tsubai, all of Nagaokakyo, Japan

[73] Assignee: Mitsubishi Paper Mills, Ltd., Tokyo, Japan

[21] Appl. No.: 822,192

[22] Filed: Aug. 5, 1977

[30] Foreign Application Priority Data

Aug. 10, 1976 [JP] Japan .................................. 51-95274

[51] Int. Cl.$^2$ ........................... G03C 5/54; G03C 1/48
[52] U.S. Cl. ..................................... 96/76 R; 96/29 L
[58] Field of Search .................. 96/29 L, 76 R, 119 R

[56] References Cited

U.S. PATENT DOCUMENTS

| 2,503,776 | 4/1950 | Sprague | 96/138 |
| 2,912,343 | 11/1959 | Collins et al. | 96/137 |
| 3,314,796 | 4/1967 | Gotze et al. | 96/101 |
| 3,342,605 | 9/1967 | McCrossen et al. | 96/94 R |
| 3,431,111 | 3/1969 | Brooker et al. | 96/88 |
| 3,482,981 | 12/1969 | Van Lare | 96/137 |
| 3,485,635 | 12/1969 | Owen et al. | 96/120 |
| 3,501,307 | 3/1970 | Illingsworth | 96/101 |
| 3,585,195 | 6/1971 | Heseltine et al. | 260/240.65 |
| 3,649,286 | 3/1972 | Ogilvie | 96/120 |
| 3,728,114 | 4/1973 | Futaki et al. | 96/29 L |
| 3,736,872 | 6/1973 | Martens et al. | 96/29 L |
| 3,870,479 | 3/1975 | Kubotera et al. | 96/29 L |
| 3,989,521 | 11/1976 | Deltaas et al. | 96/29 L |

FOREIGN PATENT DOCUMENTS 723019  2/1955  United Kingdom.

OTHER PUBLICATIONS

"Spectral sensitization of mobile positive holes", Berriman et al., Photo. Sci. and Engineering 17, No. 2, Mar.-/Apr. 1973, pp. 235-244.

Primary Examiner—Richard L. Schilling
Attorney, Agent, or Firm—Cushman, Darby & Cushman

[57] ABSTRACT

Printabilities of offset printing plates which utilizes silver complex diffusion transfer process are improved by adding to silver halide emulsion at least one of betaine type cyanine dyes and anion type cyanine dyes.

8 Claims, No Drawings

OFFSET PRINTING PLATE

BACKGROUND OF THE INVENTION

This invention concerns an offset printing plate and more particularly it relates to direct use of a silver image obtained by silver complex diffusion transfer process as an offset printing plate.

One type of such offset printing plates, as disclosed in, e.g., U.S. Pat. No. 3,728,114, comprise a light sensitive sheet and an image-receiving sheet and an oleophilic silver image is obtained on the image-receiving sheet by subjecting the light sensitive sheet to an imagewise exposure, then bringing the light sensitive sheet and the image-receiving sheet into superposed relationship and subjecting it to diffusion transfer development. Another type of the printing plates comprise a light sensitive sheet on which an image-receiving layer is directly provided and an oleophilic silver image is obtained by subjecting the sheet to imagewise exposure and then to diffusion transfer development. The light sensitive sheet comprises a support such as a waterproof paper or synthetic resin film which has been treated to render its surface hydrophilic and which carries a photographic emulsion layer mainly composed of silver halide emulsion. When a negative-type emulsion is used as the silver halide emulsion a positive-direct offset printing plate is obtained and when a direct-positive type emulsion is used a negative direct offset printing plate is obtained.

Such direct offset printing plates require printabilities, e.g., good ink receptivity, water retention, surface strength, etc. However, effects of emulsion layers on such printabilities have not yet been fully clarified. Improvements in the emulsion layer are disclosed in Japanese Patent Application Kokai (Laid-Open) No. 55,402/74 and Japanese Patent Application No. 35,767/75, but these are not sufficient.

In order to produce high speed direct offset printing plates, it is necessary to use high speed silver halide emulsion and for this purpose spectral sensitization has been employed. However, when cationic cyanine dyes are used, diffusion transfer development is inhibited to cause reduction in the amount of silver deposited on the image-receiving layer or to cause no deposition of silver. Besides the reduction in the amount of silver, there occurs unevenness on the boundary between the developed and undeveloped portions which is called "edge effect" and printabilities of direct offset printing plates are markedly decreased.

SUMMARY OF THE INVENTION

As the result of the inventor's intensive researches on production of high speed direct offset printing plates with preventing the decrease in the printabilities, it has been found that a high speed direct offset printing plate having desired printabilities can be obtained by adding a betaine type or anion type cyanine dye to the silver halide emulsion.

Accordingly, it is an object of this invention to provide a high speed direct offset printing plate.

It is another object of this invention to provide a direct offset printing plate having desired printabilities.

These and other objects will be clear from the following disclosure.

DESCRIPTION OF THE INVENTION AND THE PREFERRED EMBODIMENTS

Among the betaine type or anion type sensitizing dyes used in this invention, especially useful dyes are selected from those which are represented by the following general formulas (I) and (II).

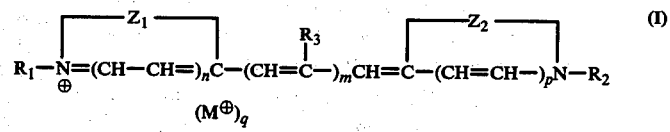

[wherein at least one of $R_1$ and $R_2$ represent sulfoalkyl groups of $C_1$–$C_5$ (such as γ-sulfopropyl, δ-sulfobutyl, etc.) and/or carboxyalkyl groups of $C_1$–$C_5$ (such as β-carboxyethyl, γ-carboxypropyl, etc.) and the rest of $R_1$ and $R_2$ represents an alkyl group of $C_1$–$C_5$ (such as methyl, ethyl, propyl, butyl, etc.), substituent-containing alkyl groups of $C_1$–$C_5$ (such as hydroxy alkyl groups, e.g., β-hydroxyethyl and γ-hydroxypropyl, acyloxyalkyl groups, e.g., β-acetoxyethyl, γ-acetoxypropyl and β-benzoyloxyethyl, and alkoxyalkyl groups, e.g., β-methoxyethyl, β-ethoxyethyl, etc.), alkenyl groups (such as allyl, etc.), aralkyl groups (such as benzyl, phenetyl, etc.) and aryl groups (such as phenyl, p-nitrophenyl, etc.), $R_3$ represents an alkyl group of $C_1$–$C_5$ or hydrogen atom, M represents an alkali metal atom (such as sodium, potassium, etc.) or ammonium group, n, m, p and q represent 0 or 1 and $Z_1$ and $Z_2$ represent non-metal atom groups necessary to complete five or six-membered nitrogen-containing heterocyclic ring nuclei, specific examples of which are as follows: oxazoline nuclei, oxazole nuclei (e.g., 4-methyloxazole, 5-methyloxazole, 4-phenyloxazole, 5-phenyloxazole, 4,5-diphenyloxazole, etc.), benzooxazole nuclei (e.g., benzoxazole, 5-chlorobenzoxazole, 5-methylbenzoxazole, 5-phenylbenzoxazole, 5,6-dimethylbenzoxazole, 5-methoxybenzoxazole, 5-ethoxybenzoxazole, 6-methoxybenzoxazole, 5-acetylbenzoxazole, 5-benzoylbenzoxazole, 5-chloro-6-methylbenzoxazole, 5-carboxybenzoxazole, 5-ethoxycarbonylbenzoxazole, 6-nitrobenzoxazole, 5-chloro-6-nitrobenzoxazole, 5-hydroxybenzoxazole, 6-hydroxybenzoxazole, etc.), naphthoxazole nuclei (e.g., α-naphthoxazole, β-naphthoxazole, etc.), thiazoline nuclei (e.g., thiazoline, 5-methylthiazoline, etc.), thiazole nuclei (e.g., thiazole, 4-methylthiazole, 4-phenylthiazole, 5-methylthiazole, 5-phenylthiazole, 4,5-dimethylthiazole, 4,5-diphenylthiazole, etc.), benzothiazole nuclei (e.g., benzothiazole, 4-chlorobenzothiazole, 5-chlorobenzothiazole, 6-chlorobenzothiazole, 7-chlorobenzothiazole, 5-methylbenzothiazole, 6-methylbenzothiazole, 5,6-dimethylbenzothiazole, 5-bromobenzothiazole, 6-bromobenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 5-methoxycarbonylbenzothiazole, 5-ethoxybenzothiazole, tetrahydrobenzothiazole, 5-N,N-dimethylaminobenzothiazole, 5,6-dimethoxybenzothiazole, 5-hydroxybenzothiazole, 6-hydroxybenzothiazole, 5-carboxybenzothiazole, 5-nitrobenzothiazole, 6-nitrobenzothiazole, 5-chloro-6-nitrobenzothiazole, 5,6-methylenedioxybenzothiazole, etc.), naphthothiazole nuclei (e.g., α-naphthothiazole, β-naphthothiazole, 5-methoxy-β-naphthothiazole, 5-ethoxy-β-naphthothiazole, 8-methoxy-α-naphthothiazole, 7-methoxy-α-naphthothiazole, etc.), benzoselenazole nuclei (e.g., benzoselenazole, 5-chlorobenzoselenazole, 5-methoxybenzoselenazole, 5-hydroxybenzoselenazole, tetrahydrobenzoselenazole, etc.), naphthoselenazole nuclei (e.g., α-naphthoselenazole, β-naphthoselenazole, etc.), 2-pyridine nuclei (e.g., 2-pyridine, 3-methylpyridine, 4-methylpyridine, 5-methylpyridine, 3,4-dimethylpyridine, 4-chloropyridine, 3-hydroxypyridine, 3-phenylpyridine, etc.), 4-pyridine nuclei (e.g., 4-pyridine, 2-methylpyridine, 3-methylpyridine, 3-chloropyridine, 2,6-dimethylpyridine, 3-hydroxypyridine, etc.), 2-quinoline nuclei (e.g., 2-quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline, 8-hydroxyquinoline, etc.), 4-quinoline nuclei (e.g., 4-quinoline, 6-methoxyquinoline, 7-methylquinoline, 8-methylquinoline, etc.), 1-isoquinoline nuclei (e.g., 1-isoquinoline, 3,4-dihydroisoquinoline, etc.), 3-isoquinoline nuclei (e.g., 3-isoquinoline, 5-methylisoquinoline, 1-methylisoquinoline, 6-chloroisoquinoline, 6-methoxyisoquinoline, 8-methoxyisoquinoline, etc.), imidazole nuclei (e.g., 1-methylimidazole, 1-ethyl-4-phenylimidazole, 1-butyl-4,5-dimethylimidazole, etc.), benzimidazole nuclei (e.g., 1-methylbenzimidazole, 1-ethyl-5,6-dichlorobenzimidazole, etc.), naphthoimidazole nuclei (e.g., 1-methyl-α-naphthoimidazole, 1-ethyl-β-naphthoimidazole, etc.), indolenine nuclei (e.g., 3,3-dimethylindolenine, 3,3,5-trimethylindolenine, 3,3,7-trimethylindolenine, 5-hydroxy-3,3-dimethylindolenine, 6-chloro-3,3-dimethylindolenine, 3,3-dimethyl-5-nitroindolenine, etc.), imidazo[4,5-b]quinoxaline nuclei (e.g., 1,3-diethylimidazo[4,5-b]quinoxaline, 1,3-diethyl-6-nitroimidazo[4,5-b]quinoxaline, 1,3-diphenylimidazo[4,5-b]quinoxaline, 6-chloro-1,3-diphenylimidazo[4,5-b]quinoxaline, 1,3-diallylimidazo[4,5-b]quinoxaline, etc.), 2-naphthyridine-(1,8) nuclei (e.g., 1,8-naphthyridine, 4-methyl-1,8-naphthyridine, 6-methyl-1,8-naphthyridine, 7-methyl-1,8-naphthyridine, etc.), 4-naphthyridine(1,8) nuclei (e.g., 1,8-naphthyridine, 2-methyl-1,8-naphthyridine, 5-methyl-1,8-naphthyridine, 6-methyl-1,8-naphthyridine, 2,7-dimethyl-1,8-naphthyridine, etc.), pyrroline nuclei, etc.].

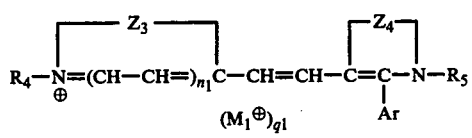

(II)

[wherein at least one of $R_4$ and $R_5$ represent such sulfoalkyl groups and/or carboxyalkyl groups as defined on $R_1$ and $R_2$ of the general formula (I) and the rest of $R_4$ and $R_5$ represents an alkyl group, a substituted alkyl group, an aralkyl group, an alkenyl group or aryl group as defined on $R_1$ and $R_2$, $M_1$ is an alkali metal atom or ammonium group, $Z_3$ and $Z_4$ represent non-metal atom groups necessary to complete five- or six-membered nitrogen-containing heterocyclic ring nuclei, examples of which are the same as those of $Z_1$ and $Z_2$, Ar represents an aryl group or a substituted aryl group such as phenyl, p-methoxyphenyl, p-ethylphenyl, p-chlorophenyl, m-nitrophenyl, p-nitrophenyl, etc., and $n_1$ and $q_1$ represent 0 or 1].

The silver halide emulsions used in this invention include, e.g., silver chloride, silver bromide, silver chlorobromide, silver chloroiodine, silver iodobromide, silver chloroiodobromide, etc. In order to obtain high speed silver halide emulsions, it is preferred to use silver iodobromide emulsion or silver chloroiodobromide emulsion in which silver halide grains contain at least 95 mol % of bromide. Either of negative-type or direct-positive silver halide emulsions may be used in this invention. Since a larger amount of sensitizing dye is used in the case of the direct-positive type silver halide emulsion than in the case of the negative-type emulsion, the effect intended by this invention is liable to be greater in the case of the direct-positive type emulsion.

The amount of the dye which can be used in the invention cannot be set forth specifically since the amount varies depending upon the amount of silver halide in the emulsion and the surface area of the silver halide grains. However, an amount of about $1 \times 10^{-6}$ to $2 \times 10^{-2}$ mol per 1 mol of silver salt provides particularly preferable results. These dyes are used by dissolving in water or a water-miscible solvent such as methanol, ethanol, ethylene glycol monomethyl ether, methyl ethyl ketone, acetone, pyridine, and the like. Ultrasonic vibration can be used for the dissolution of these dyes. Also, methods employed upon sensitizing negative-type emulsions described in, e.g., U.S. Pat. Nos. 3,482,981; 3,585,195; 3,469,987; 3,649,286; 3,485,634; 3,342,605 and 2,912,343, etc. can be used.

The addition of the dyes to an emulsion is conveniently conducted immediately before coating. However, the dyes can be added during chemical ripening or upon formation of the silver halide.

Such direct-positive silver halide emulsions, as disclosed in British Pat. No. 723,019, comprises fogged silver halide grains and an electron accepting compound and generally a densensitizing dye having polarographic oxidation half-wave potential and reduction half-wave potential which give a positive sum is used as said electron accepting compound. Negative-type direct offset printing plates can be obtained by using said direct-positive silver halide emulsions.

Among the sensitizing dyes used in this invention, preferred dyes used for preparation of negative-type direct offset printing plates are represented by the following general formulas (III), (IV) or (V).

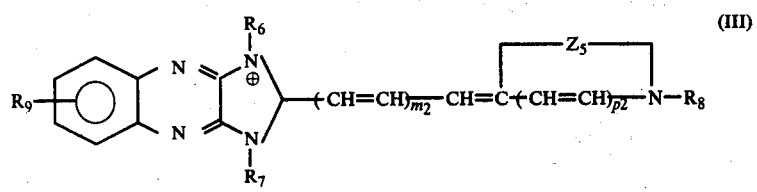

(wherein $R_6$ and $R_7$ represent alkyl groups of $C_1-C_5$, aralkyl groups or aryl groups, $R_8$ represents a sulfoalkyl group of $C_1-C_5$ or a carboxyalkyl group of $C_1-C_5$, $R_9$ represents an alkyl group of $C_1-C_5$ as defined on $R_1$ and $R_2$, a substituent-containing alkyl group of $C_1-C_5$, an alkoxy group of $C_1-C_5$, nitro group, a halogen atom or hydrogen atom, $Z_5$ represents a non-metal atom group necessary to complete a 5- or 6-membered nitrogen-containing heterocyclic ring nucleus, examples of which are the same as those of $Z_1$ and $Z_2$ and $m_2$ and $p_2$ represent

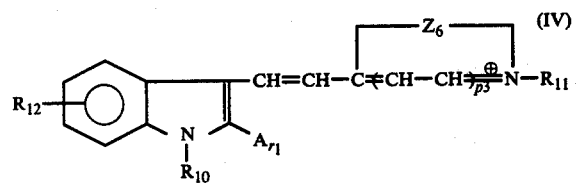

(wherein $R_{10}$ represents an alkyl group of $C_1-C_5$, an aralkyl group, an alkenyl group or an aryl group, $R_{11}$ represents a sulfoalkyl group of $C_1-C_5$ or a carboxyalkyl group of $C_1-C_5$, $R_{12}$ represents an alkyl group of $C_1-C_5$ as defined on $R_1$ and $R_2$, a substituent-containing alkyl group of $C_1-C_5$, an alkoxy group of $C_1-C_5$, nitro group, a halogen atom or hydrogen atom, $A_{r1}$ represents an aryl group or a substituted aryl group, $Z_6$ represents a non-metal atom group necessary to complete a 5- or 6-membered nitrogen-containing heterocyclic ring nucleus, examples of which are the same as those of $Z_1$ and $Z_2$ and $p_3$ represents 0 or 1).

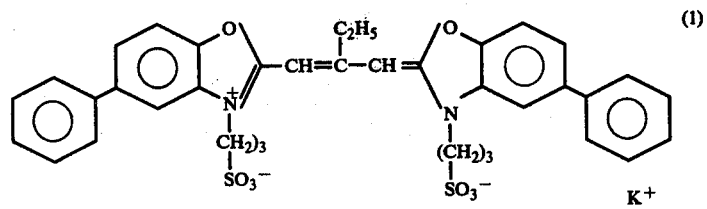

[wherein at least one of $R_{13}$ and $R_{14}$ represent sulfoalkyl groups of $C_1-C_5$ and/or carboxyalkyl groups of $C_1-C_5$ and the rest represents an alkyl group of $C_1-C_5$ as defined on $R_1$ and $R_2$, a substituent-containing alkyl group of $C_1-C_5$, an aralkyl group, an aryl group or an alkenyl group, $R_{15}$ represents nitro group, a halogen atom or hydrogen atom, $M_4$ represents an alkali metal atom or ammonium group, $Z_7$ represents a non-metal atom group necessary to complete a 5- or 6-membered nitrogen-containing heterocyclic ring nucleus such as benzothiazole nucleus, naphthothiazole nucleus, 2-quinoline nucleus, 4-quinoline nucleus, indolenine nucleus, 2-naphthyridine(1,8)nucleus, 4-naphthyridine (1,8) nucleus, etc. and $p_4$ and $q_4$ represent 0 or 1.].

Such dyes may be prepared in the same manner as disclosed in, for example, U.S. Pat. Nos. 3,314,796 and 3,431,111.

Typical examples used in this invention are as follows:

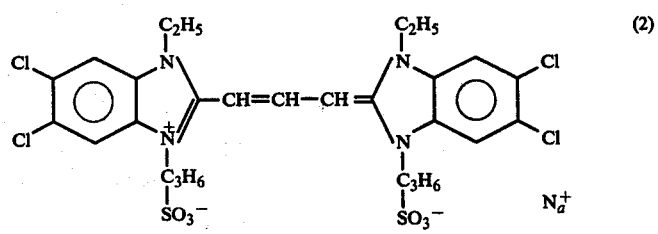

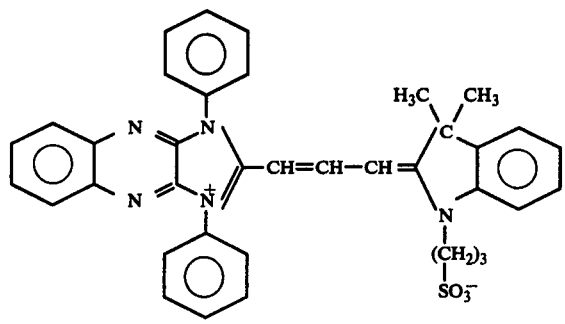
(3)
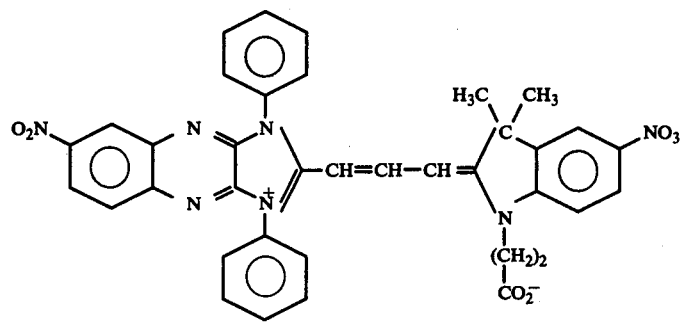
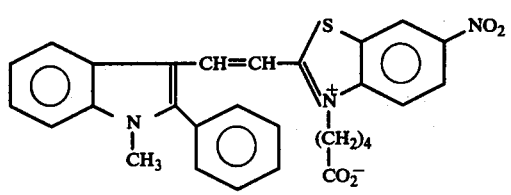
(5)
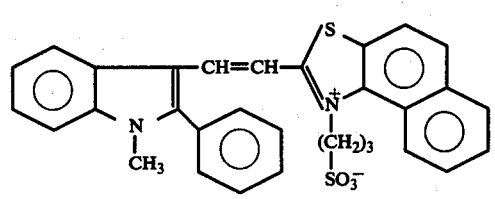
(6)
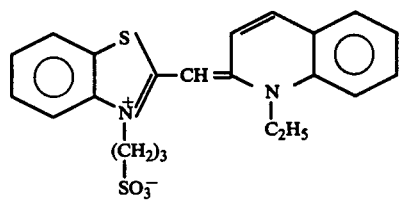
(7)
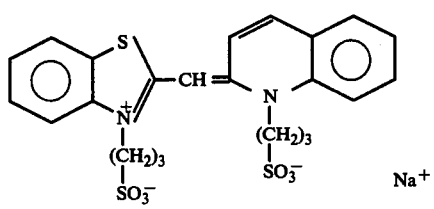
(8)
Na⁺
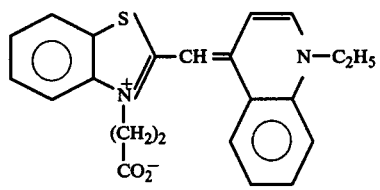
(9)

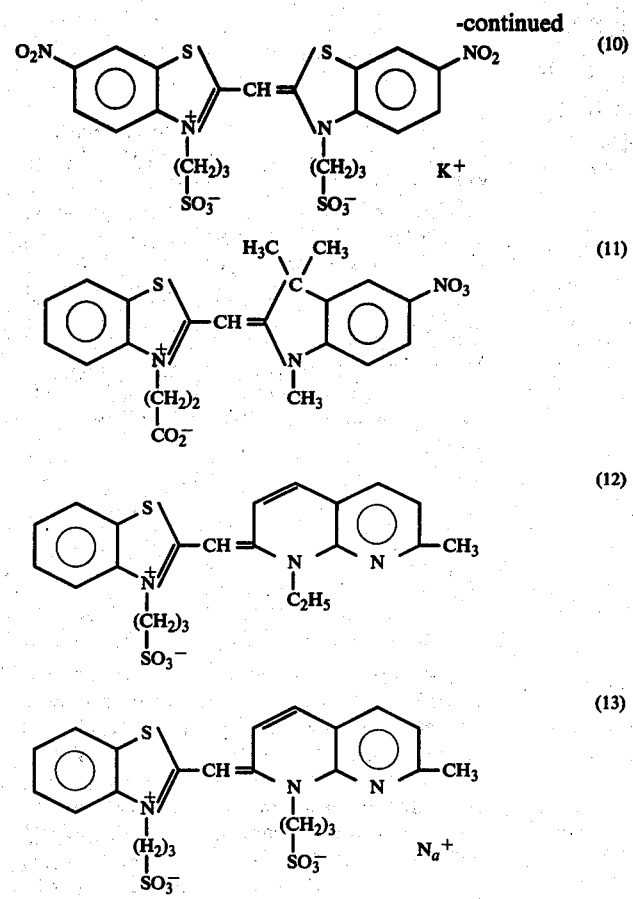

The silver halide emulsions used in this invention include both monodispersed and not monodispersed, but the monodispersed emulsions are more preferred.

The silver halide emulsions used in this invention may be chemically sensitized by various techniques, particularly good results being obtained with techniques of the type described by Antoine Hautot and Henri Saubenier in Science et Industries Photographiques, vol. 28 (1957), pp. 57 to 65. Especially, in the direct-positive silver halide emulsions, fogged emulsions can be prepared by combinations of reducing agents with compounds of a metal more electropositive than silver. High speed direct-positive silver halide emulsions can be obtained by, e.g., U.S. Pat. No. 3,501,307.

The densensitizing dyes used in this invention are organic desensitizing dyes having polarographic oxidation half-wave potential and reduction half-wave potential which give a positive sum. It is well known that there is a strong correlation between the polarographic oxidation half-wave potential and reduction half-wave potential and electron acceptability of the desensitizing dyes as described by R. W. Berriman and P. B. Gilman Jr. in Photographic Science and Engineering, Vol. 17, (1973), pp. 235-244. Specific examples of the desensitizing dyes used in this invention are pinacryptol yellow, phenosafranine, Methylene Blue, pinacryptol green, 3-ethyl-5-m-nitrobenzylidenerhodamine, 3,3'-diethyl-6,6'-dinitrothiacarbocyanine iodide and the like.

The amount of the organic desensitizing dye which can be used in the invention cannot be set forth specifically since it also varies depending upon the kind of the desensitizing dye used. However, the desensitizing dye is added preferably in an amount of about $2 \times 10^{-7}$ to $10^{-1}$ mol per 1 mol of the silver halide.

In this invention, the silver halide emulsions can contain additional additives such as stabilizers, brighteners, ultraviolet absorbers, hardeners, surfactants, preservatives, plasticizers, matting agents and the like.

Examples of supports used in this invention are resin films such as polyethylene terephthalate, cellulose acetate, etc., synthetic papers, waterproof papers and the like. Preferably, the supports are subjected to corona discharging treatment or undercoating treatment to impart them sufficient adhesion strength to stand offset printing.

The direct offset printing plate of this invention is obtained by providing a surface layer (image-receiving layer) containing nuclei for physical development which consist of fine particle of heavy metals, sulfides thereof and the like directly on a light sensitive sheet or on a hydrophilic undercoat layer on a suitable support, surface of at least a part of said fine particles being naked. When the light sensitive sheet is exposed imagewise and is subjected to diffusion transfer development in contact with the image-receiving layer, an oleophilic silver image is formed on the image-receiving layer. This oleophilic silver image has affinity to ink and other hydrophilic part repels ink. Therefore, this sheet can be used as a printing plate.

The first characteristic of this invention is that a high speed direct offset printing plate can be obtained.

The second characteristic of this invention is that a printing plate can be produced rapidly with simple treatments.

The third characteristic of this invention is that since exposure and development treatment is simple, mechanization or automatization of the plate-making can be easily made.

This invention can be further illustrated by the following examples of preferred embodiments thereof although it will be understood that these examples are included merely for purposes of illustration and are not intended to limit the scope of the invention.

EXAMPLE 1

Emulsions were prepared from the following composition as follows:

| | | |
|---|---|---|
| (I) | Gelatin | 5 g |
| | Ammonia water (28%) | 2.6 ml |
| | 0.1 N aqueous solution of potassium bromide | 20 ml |
| | Water to make 200 g | |
| (II) | Silver nitrate | 68 g |
| | Water to make 200 g | |
| (III) | Potassium bromide | 46.4 g |
| | Potassium iodide | 1.7 g |
| | Water to make 200 ml | |
| (IV) | 6N sulfuric acid | |

With vigorous agitation, to liquid (I) kept at 40° C. were added simultaneously liquids (II) and (III) over a period of 80 minutes and then was added liquid (IV) to adjust the pH to 3.0. Gelatin was added so that the weight ratio gelatin/silver was 0.6, then an aqueous solution of sodium sulfate was added to cause precipitation. Then, the precipitate was washed with water. The resultant primitive emulsion was a cubic monodispersed silver iodobromide emulsion which contained 97.5 mol % of bromide and which had a mean grain size of 0.8μ, at least 95% by weight of grains having a size which is within ±20% of the mean grain size. Said primitive emulsion was redissolved and gelatin was added thereto to adjust the weight ratio gelatin/silver to 1. Then, this was sensitized with sulfur and gold. The dye (1) enumerated hereinbefore was added to one portion of the resultant emulsion and the following dye (a) was added to one portion of the emulsion in the amounts as shown in Table 1. Furthermore, a stabilizer, a hardener and a surfactant were added to each of these emulsions. Each of the emulsions was coated on an undercoated polyethylene terephthalate film and was dried. The amount of the coated silver was 1.3 g/m².

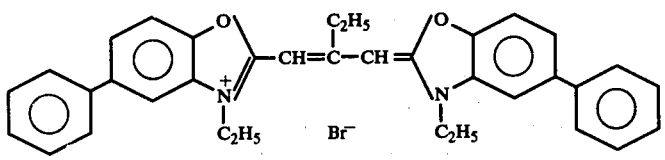

Then, palladium sulfide sol was prepared in the following manner.

| | | |
|---|---|---|
| (V) | Palladium chloride | 5 g |
| | Hydrochloric acid | 40 ml |
| | Water | 1 l |
| (VI) | Sodium sulfide | 8.6 g |
| | Polyethylene glycol alkyl ether 10% | 30 ml |
| | Water | 1 l |

| | | |
|---|---|---|
| (VII) | Methylvinyl ether/maleic anhydride copolymer ("Gantrez AN" of GAF Co.) | 100 ml |

The liquids (V) and (VI) were mixed with agitation and then liquid (VII) was incorporated thereinto. The resultant palladium sulfide sol was coated on the emulsion layer at a rate of 5 m/min by dipping method.

The resultant sheets (A) and (B) and blank sheet (C) were cut to suitable size and these were exposed through an optical wedge having difference in density of 0.15. Then, these were treated with a developer for Mitsubishi Silver Master (a treating solution for silver complex diffusion transfer) at 30° C. for 1 minute, subjected to stopping and washed with water. The results are shown in Table 1.

Table 1

| Sheet | Dye | Amount (mg/mol Ag) | Relative speed | Amount of deposited silver | edge effect |
|---|---|---|---|---|---|
| (A) | Blank | 0 | 100 | Great | None |
| (B) | (a) | 150 | 314 | Small | Occured |
| (C) | (1) | 150 | 646 | Great | None |

The term "relative speed" in the above table is a relative value of a reciprocal of exposure amount at the critical point where no deposition of silver occurs.

As is clear from the above results, sheet (B) had a photographic speed of about three times that of sheet (A), but was small in the amount of the deposited silver and had the edge effect and so the sheet (B) was not preferred as a printing plate. Sheet (C) had a photographic speed of about six times and about two times that of sheet (A) and sheet (B), respectively and moreover sheet (C) had no edge effect. The sheets (B) and (C) were enlarged by a process camera, developed with Mitsubishi Silver Master developer by a Hishirapid processor, treated with fixing solution (VIII) and damping solution (IX) for offset printing and set in an offset printing machine (offset printing machine 250 manufactured by Addressograph-Multigraph Corp. in U.S.A.) and printing was carried out.

| | | |
|---|---|---|
| Fixing solution (VIII) | | |
| | Ammonium dihydrogenphosphate | 25 g |
| | Carboxymethylcellulose | 2.5 g |
| | Water to make 1 l | |
| Dampling solution (IX) | | |
| | Ammonium dihydrogenphosphate | 1 g |
| | Nickel nitrate hexahydrate | 1.5 g |
| | Carboxymethylcellulose | 0.4 g |
| | Glycerine | 10 g |
| | Water to make 1 l | |

Usual offset ink was used as a printing ink. Only less than 100 copies could be obtained using sheet (B) while more than 2,000 copies were obtained using sheet (C). As is clear from this result the effect of this invention was remarkable in positive-type direct offset printing plate.

EXAMPLE 2

Emulsion was prepared from the following composition in the following manner.

| | | |
|---|---|---|
| (X) | Gelatin | 5 g |
| | 0.1 N aqueous solution of potassium bromide | 20 ml |
| | 1 N sulfuric acid | 5 ml |
| | Water to make 200 g | |
| (XI) | Silver nitrate | 136 g |
| | Water to make 400 ml | |
| (XII) | Potassium bromide | 92.8 g |
| | Potassium iodide | 3.3 g |
| | Water to make 400 ml | |
| (XIII) | 6 N sulfuric acid | |

With vigorous agitation, to liquid (X) kept at 60° C. were added simultaneously liquid (XI) and liquid (XII) over the period of 80 minutes, during which $P_{Ag}$ was controlled to 7.4. Then, liquid (XIII) was added to adjust pH to 3.0 and gelatin was added so that the weight ratio gelatin/silver was 0.6. Thereafter, an aqueous solution of sodium sulfate was added to produce a precipitate, which was washed with water. The resultant primitive emulsion was a cubic monodispersed silver iodobromide emulsion which contained 97.5 mol % of bromide and which had a mean grain size of 0.25μ, at least 95% by weight of grains having a size which was within ±20% of the mean grain size. After redissolving said primitive emulsion, gelatin was added to adjust the weight ratio gelatin/silver to 1 and then the emulsion was fogged with a reducing agent and a gold salt in combination. Dye (3) enumerated hereinbefore was added to a portion of the emulsion and the following dye (b) was added to a portion of the emulsion in the amounts as shown in Table 2. Then, 200 mg/mol Ag of pinacryptol yellow was added to each of the emulsion and a hardener and a surfactant were added thereto. Each of the resultant emulsions was coated on an undercoated waterproof paper and dried. The amount of silver coated was 1.3 g/m².

(b)

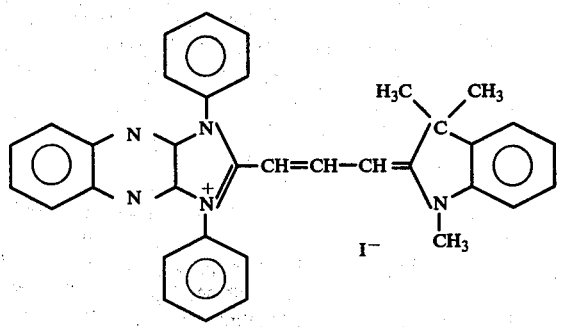

In the same manner as in Example 1, sensitometry of these samples was conducted and the results are shown in Table 2.

Table 2

| Sheet | Dye | Amount (mg/mol Ag) | Relative speed | Amount of deposited silver | Edge effect |
|---|---|---|---|---|---|
| (D) | Blank | 0 | 100 | Great | None |

Table 2-continued

| Sheet | Dye | Amount (mg/mol Ag) | Relative speed | Amount of deposited silver | Edge effect |
|---|---|---|---|---|---|
| (E) | (b) | 400 | 646 | Small | Occurred |
| (F) | (3) | 400 | 794 | Great | None |

As is clear from the above results, sheet (E) had a photographic speed of about six times that of sheet (D), but was small in the amount of deposited silver and had the edge effect and so sheet (E) was not preferred as a printing plate. Sheet (F) had a photographic speed of about eight times that of sheet (D) and about 1.1 time that of sheet (E), had no edge effect and was excellent in printabilities.

Thus, high speed negative-type direct offset printing plates having excellent printabilities can be obtained by using the direct-positive silver halide emulsion according to this invention.

EXAMPLE 3

Emulsion was prepared from the following compositions in the following manner.

| | | |
|---|---|---|
| (XIV) | Gelatin | 40 g |
| | Water | 280 ml |
| | Sodium chloride | 12 g |
| (XV) | Silver nitrate | 120 g |
| | Water | 1000 ml |
| (XVI) | Potassium bromide | 85 g |
| | Potassium idoide | 1.6 g |
| | Rhodium chloride solution* | 3.0 ml |
| | Ammonia (28%) | 100 ml |
| | Water | 920 ml |
| (XVII) | 6 N sulfuric acid | |

*Solution prepared by dissolving 0.1 g of $RhCl_2 \cdot 4H_2O$ in 100 ml of 25% aqueous sodium chloride solution.

Liquid (XV) was added to liquid (XIV) at 40° C. and furthermore liquid (XVI) was added thereto with agitation. Then, this was ripened at 40° C. for 15 minutes, thereafter liquid (XVII) was added to adjust pH to 3.0 and aqueous solution of sodium sulfate was added to produced a precipitate, which was washed with water. The resultant primitive emulsion was a silver chloroiodobromide emulsion containing at least 95 mol % of bromide. Emulsions were prepared in the same manner as in Example 2 except dye (5) enumerated hereinbefore and the following dye (C) were added in the amounts as shown in Table 3. The resultant emulsions were coated and dried in the same manner as in Example 1. Then, sensitometry of each sample was carried out and the results are shown in Table 3.

(c)

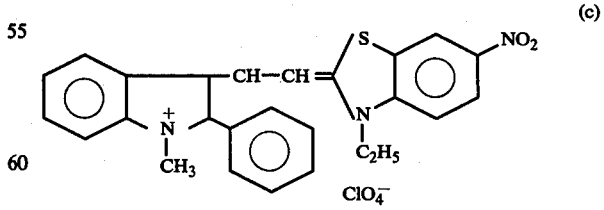

Table 3

| Sheet | Dye | Amount (mg/mol Ag) | Relative speed | Amount of deposited silver | Edge effect |
|---|---|---|---|---|---|
| (G) | Blank | 0 | 100 | Great | None |

Table 3-continued

| Sheet | Dye | Amount (mg/mol Ag) | Relative speed | Amount of deposited silver | Edge effect |
|---|---|---|---|---|---|
| (H) | (C) | 300 | — | None | — |
| (J) | (5) | 300 | 314 | Great | None |

No silver was deposited in sheet (H) and this could not be used as a printing plate. On the other hand sheet (J) of this invention had a photographic speed of about three times that of sheet (G) and regarding the amount of the deposited silver the two sheets were similar to each other. Furthermore, sheet (J) exhibited no edge effect. Thus, the effect obtained by this invention was remarkable.

EXAMPLE 4

Emulsions were prepared as follows:

| (XVIII) | Gelatin<br>Ammonia water (28%)<br>0.1 N aqueous solution of potassium bromide<br>Water to make 200 g | 5 g<br>1.3 ml<br><br>20 ml |
|---|---|---|
| (XIX) | Silver nitrate<br>Water to make 200 ml | 68 g |
| (XX) | Potassium bromide<br>Potassium iodide<br>Water to make 200 ml | 46.8 g<br>0.6 g |
| (XXI) | 6 N sulfuric acid | |

With vigorous agitation, to liquid (XVIII) kept at 40° C. were added simultaneously liquids (XIX) and (XX) over the period of 80 minutes and then liquid (XXI) was added to adjust the pH to 3.0. Gelatin was added thereto at a weight ratio gelatin/silver of 0.6. Then, an aqueous solution of sodium sulfate was added to produce a precipitate, which was washed with water. The resultant primitive emulsion was a cubic monodispersed silver iodobromide emulsion which contained 99 mol % of bromide and had a mean grain size of 0.6μ, at least 95% by weight of the grains having a size which is within ±20% of the mean grain size. Emulsions were prepared in the same manner as in Example 2 except that dyes (7) and (8) enumerated hereinbefore and the following dye (d) were employed as the dye in the amounts as shown in Table 4. Then, the resultant emulsions were coated and dried in the same manner as in Example 2. In the same manner as in Example 1, sensitometry of these samples were effected. The results are shown in Table 4.

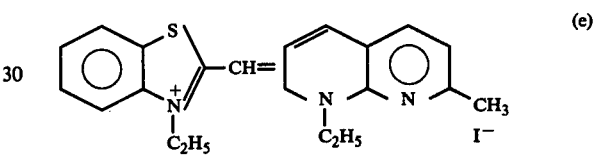
(d)

Table 4

| Sheet | Dye | Amount (mg/mol Ag) | Relative speed | Amount of deposited silver | Edge effect |
|---|---|---|---|---|---|
| (K) | Blank | 0 | 100 | Great | None |
| (L) | (d) | 300 | — | None | — |
| (M) | (7) | 300 | 562 | Great | None |
| (N) | (8) | 300 | 392 | Great | None |

No silver was deposited in sheet (K) and could not be used as a printing plate. On the other hand, sheets (M) and (N) of this invention had a photographic speed of about 5.5 times and about 4 times that of sheet (K), respectively, had the deposited silver in the similar amount to that of sheet (K) and showed no edge effect. From these results, the effect of this invention was remarkable.

EXAMPLE 5

Primitive emulsions were prepared in the same manner as in Example 4 except that dyes (12) and (13) enumerated hereinbefore and the following dye (e) were employed in the amounts as shown in Table 5. Then, in the same manner as in Example 2, emulsions were prepared, coated and dried. Thereafter, each sample was subjected to sensitometry. The results are shown in Table 5.

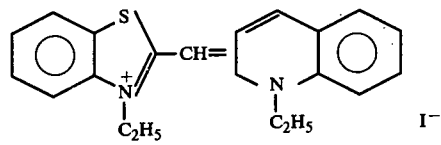
(e)

Table 5

| Sheet | Dye | Amount (mg/mol Ag) | Relative speed | Amount of deposited silver | Edge effect |
|---|---|---|---|---|---|
| (P) | Blank | 0 | 100 | Great | None |
| (Q) | (e) | 300 | — | None | — |
| (R) | (12) | 300 | 603 | Great | None |
| (S) | (13) | 300 | 417 | Great | None |

No silver was deposited in sheet (Q) and could not be used as a printing plate. Sheets (R) and (S) of this invention had a photographic speed of about 6 times and about 4 times that of sheet (P), had the deposited silver in the similar amount to that of sheet (P) and showed no edge effect. Printing was carried out using the sheets (R) and (S) in the same manner as in Example 1 to obtain more than 2,000 copies. Thus, when the direct-positive silver halide emulsion of this invention was used, high speed negative-type offset printing plates having preferred printabilities were obtained.

What is claimed is:

1. An improved offset printing plate which comprises a support, a silver halide emulsion layer on the support and a surface layer containing nuclei for physical development on the emulsion layer, to which surface layer an image formed in said emulsion layer is transferred, characterized in that the silver halide emulsion contains at least one dye selected from the group consisting of betaine type cyanine sensitizing dyes and anion type cyanine sensitizing dyes.

2. An improved offset printing plate according to claim 1 wherein the sensitizing dyes are at least one of those which have the following general formulas (I) and (II):

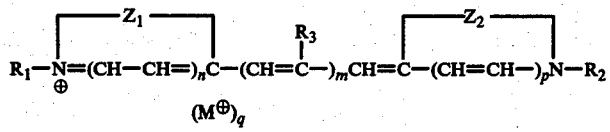

(wherein $Z_1$ and $Z_2$ represent non-metal atom groups necessary to complete 5- or 6-membered nitrogen-containing heterocyclic ring nuclei, at least one of $R_1$ and $R_2$ represents a sulfoalkyl group of $C_1$-$C_5$ a carboxyalkyl group of $C_1$-$C_5$ and the rest represents an alkyl group of $C_1$-$C_5$, a substituent-containing alkyl group of $C_1$-$C_5$, an alkenyl group, an aralkyl group or an aryl group, $R_3$ represents an alkyl group of $C_1$-$C_5$ or hydrogen atom, M represents an alkali metal atom or ammonium group and n, m, p and q represent 0 or 1), and

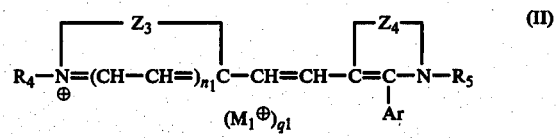

(wherein $Z_3$ and $Z_4$ represent non-metal atom groups necessary to complete 5- or 6-membered nitrogen-containing heterocyclic ring nuclei, $A_r$ represents an aryl group or a substituted aryl group, at least one of $R_4$ and $R_5$ represent a sulfoalkyl group of $C_1$-$C_5$ or a carboxyalkyl group of $C_1$-$C_5$ and the rest represents an alkyl group of $C_1$-$C_5$, a substituent-containing alkyl group, an alkenyl group, an aralkyl group or an aryl group, $M_1$ represents an alkali metal atom or ammonium group and $n_1$ and $q_1$ represent 0 or 1).

3. An improved offset printing plate according to claim 1 wherein the silver halide emulsion is silver iodobromide or silver chloroiodobromide emulsion containing at least 95 mol % of bromide.

4. An improved offset printing plate according to claim 1, wherein the silver halide emulsion is a fogged direct-positive silver halide emulsion which contains a desensitizing dye having a polarographic oxidation half-wave potential and a polarographic reduction half-wave potential which give a positive sum.

5. An improved offset printing plate according to claim 4, wherein the sensitizing dye is a dye represented by the following general formula (III):

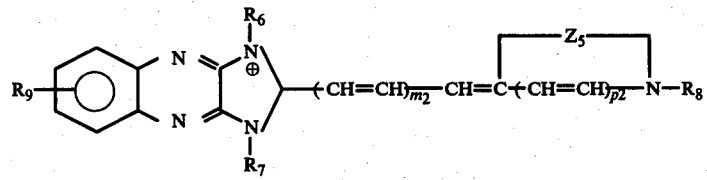

(wherein $Z_5$ represents a non-metal atom group necessary to complete a 5- or 6-membered nitrogen-containing ring nucleus, $R_6$ and $R_7$ represent an alkyl group of $C_1$-$C_5$, an aralkyl group or an aryl group, $R_8$ represents a sulfoalkyl group of $C_1$-$C_5$ or carboxyalkyl group of $C_1$-$C_5$, $R_9$ represents an alkyl group of $C_1$-$C_5$, a substituent-containing alkyl group of $C_1$-$C_5$, an alkoxy group of $C_1$-$C_5$, nitro group, a halogen atom or hydrogen atom and $m_2$ and $p_2$ represent 0 or 1).

6. An improved offset printing plate according to claim 4, wherein the sensitizing dye is a dye represented by the following general formula (IV):

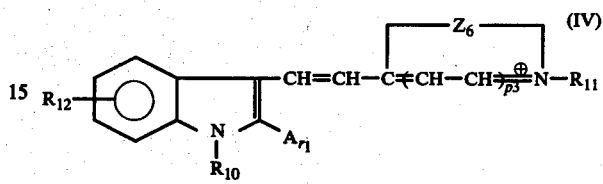

(wherein $Z_6$ represents a non-metal atom group necessary to complete a 5- or 6-membered nitrogen-containing heterocyclic ring nucleus, $A_{r1}$ represents an aryl group or a substituted aryl group, $R_{10}$ represents an alkyl group of $C_1$-$C_5$, an alkenyl group, an aralkyl group or an aryl group, $R_{11}$ represents a sulfoalkyl group of $C_1$-$C_5$ or a carboxyalkyl group of $C_1$-$C_5$, $R_{12}$ represents an alkyl group of $C_1$-$C_5$, a substituent-containing alkyl group of $C_1$-$C_5$, an alkoxy group of $C_1$-$C_5$, nitro group, a halogen atom or hydrogen atom and $p_3$ represents 0 or 1).

7. An improved offset printing plate according to claim 4, wherein the sensitizing dye has the following general formula (V):

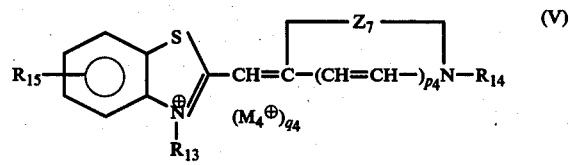

(wherein $Z_7$ represents a non-metal atom group necessary to complete a 5- or 6-membered nitrogen-containing heterocyclic ring nucleus, at least one of $R_{13}$ and $R_{14}$ represent a sulfoalkyl group of $C_1$-$C_5$ or a carboxyalkyl group of $C_1$-$C_5$ and the rest of $R_{13}$ and $R_{14}$ represents an alkyl group of $C_1$-$C_5$, a substituent-containing alkyl group of $C_1$-$C_5$, an aralkyl group, an aryl group or an alkenyl group, $R_{15}$ represents nitro group, a halogen atom or hydrogen atom, $M_4$ represents an alkali metal atom or ammonium group and $p_4$ and $q_4$ represent 0 or 1).

8. An improved offset printing plate according to claim 1 which consists of said support, said silver halide emulsion layer and said surface layer.

* * * * *

REEXAMINATION CERTIFICATE (139th)
United States Patent [19]
Yoshida et al.

[11] B1 4,134,769

[45] Certificate Issued Nov. 22, 1983

[54] OFFSET PRINTING PLATE

[75] Inventors: Akio Yoshida; Akira Tanaka; Yasuo Tsubai, all of Nagaokakyo, Japan

[73] Assignee: Mitsubishi Paper Mills, Ltd., Tokyo, Japan

Reexamination Request:
No. 90/000,306, Dec. 10, 1982

Reexamination Certificate for:
Patent No.: 4,134,769
Issued: Jan. 16, 1979
Appl. No.: 822,192
Filed: Aug. 5, 1977

[30] Foreign Application Priority Data

Aug. 10, 1976 [JP] Japan ................................. 51-95274

[51] Int. Cl.³ .................. G03C 5/54; G03C 1/48; G03F 7/02; B41M 1/00
[52] U.S. Cl. ................................. 430/199; 101/450.1; 430/204; 430/230
[58] Field of Search ................ 430/204, 230; 101/450.1

[56] References Cited

U.S. PATENT DOCUMENTS

| | | | |
|---|---|---|---|
| 2,503,776 | 4/1950 | Sprague | 430/588 |
| 3,314,796 | 4/1967 | Gotze et al. | 430/592 |
| 3,431,111 | 3/1969 | Brooker et al. | 430/580 |
| 3,615,427 | 10/1969 | Debruyn | 430/228 |
| 3,615,428 | 10/1969 | Weed | 430/228 |
| 3,679,411 | 7/1972 | Stephens | 430/228 |
| 3,681,072 | 8/1972 | Debruyn | 430/229 |
| 3,728,114 | 4/1973 | Futaki et al. | 430/204 |
| 3,736,872 | 6/1973 | Martens et al. | 430/204 |
| 3,814,602 | 6/1974 | Shinozaki et al. | 430/205 |
| 3,853,557 | 12/1974 | Fassbender | 430/229 |
| 3,874,944 | 4/1975 | Weed | 430/229 |
| 4,149,889 | 4/1979 | Yoshida et al. | 430/230 |
| 4,186,005 | 1/1980 | Haberlin et al. | 430/231 |

*Primary Examiner*—Richard L. Shilling

[57] ABSTRACT

Printabilities of offset printing plates which utilizes silver complex diffusion transfer process are improved by adding to silver halide emulsion at least one of betaine type cyanine dyes and anion type cyanine dyes.

REEXAMINATION CERTIFICATE ISSUED UNDER 35 U.S.C. 307.

OFFSET PRINTING PLATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1–8, having been finally determined to be unpatentable, are cancelled.

New claims 9–30 are added and determined to be patentable.

9. *A method of printing which comprises printing in an offset printing machine with an offset printing plate comprising a support, a silver halide emulsion layer on the support and containing at least one dye selected from the group consisting of betaine type cyanine sensitizing dyes and anion type cyanine sensitizing dyes and a surface layer containing nuclei for physical development on the emulsion layer, said surface layer having thereon an oleophilic ink-receptive silver deposited from said silver halide emulsion layer by exposing and subsequently developing with silver complex diffusion transfer developer.*

10. *A method according to claim 9 wherein the sensitizing dyes are at least one of those which have the following general formulas (I) and (II):*

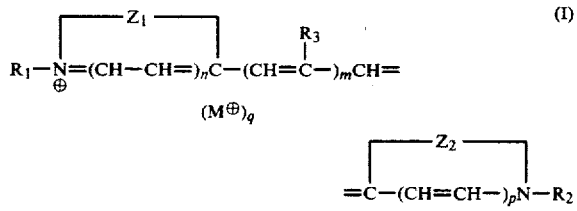

(wherein $Z_1$ and $Z_2$ represent non-metal atom groups necessary to complete 5- or 6-membered nitrogen-containing heterocyclic ring nuclei, at least one of $R_1$ and $R_2$ represents a sulfoalkyl group of $C_1$–$C_5$ or a carboxyalkyl group of $C_1$–$C_5$, and the rest represents an alkyl group of $C_1$–$C_5$, a substituent-containing alkyl group of $C_1$–$C_5$, an alkenyl group, an aralkyl group or an aryl group, $R_3$ represents an alkyl group of $C_1$–$C_5$ or hydrogen atom, M represents an alkali metal atom or ammonium group and n, m, p and q represent 0 or 1), and

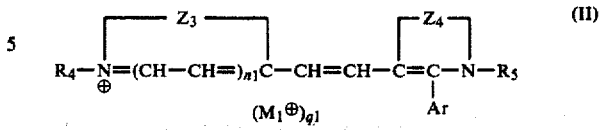

(wherein $Z_3$ and $Z_4$ represent non-metal atom groups necessary to complete 5- or 6-membered nitrogen-containing heterocyclic ring nuclei, $A_r$ represents an aryl group or a substituted aryl group, at least one of $R_4$ and $R_5$ represent a sulfoalkyl group of $C_1$–$C_5$ or a carboxyalkyl group of $C_1$–$C_5$ and the rest represents an alkyl group of $C_1$–$C_5$, a substituent-containing alkyl group, an alkenyl group, an aralkyl group or an aryl group, $M_1$ represents an alkali metal atom or ammonium group and $n_1$ and $q_1$ represent 0 or 1).

11. *A method according to claim 9 wherein the silver halide emulsion is silver iodobromide or silver chloroiodobromide emulsion containing at least 95 mol % of bromide.*

12. *A method according to claim 9, wherein the silver halide emulsion is a fogged direct-positive silver halide emulsion which contains a desensitizing dye having a polarographic oxidation half-wave potential and a polarographic reduction half-wave potential which give a positive sum.*

13. *A method according to claim 12, wherein the sensitizing dye is a dye represented by the following general formula (III):*

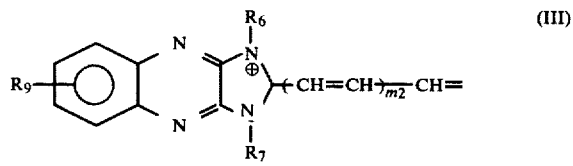

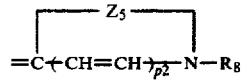

(wherein $Z_5$ represents a non-metal atom group necessary to complete a 5- or 6-membered nitrogen-containing ring nucleus, $R_6$ and $R_7$ represent an alkyl group of $C_1$–$C_5$, an aralkyl group or an aryl group, $R_8$ represents a sulfoalkyl group of $C_1$–$C_5$ or carboxyalkyl group of $C_1$–$C_5$, $R_9$ represents an alkyl group of $C_1$–$C_5$, a substituent-containing alkyl group of $C_1$–$C_5$, an alkoxy group of $C_1$–$C_5$, nitro group, a halogen atom or hydrogen atom and $m_2$ and $p_2$ represent 0 or 1).

14. *A method according to claim 12 wherein the sensitizing dye is a dye represented by the following general formula (IV):*

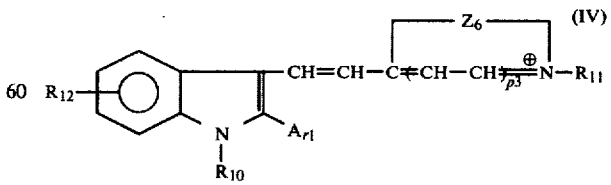

(wherein $Z_6$ represents a non-metal atom group necessary to complete a 5- or 6-membered nitrogen-containing heterocyclic ring nucleus, $A_{r1}$ represents an aryl group or a substituted aryl group, $R_{10}$ represents an alkyl group of $C_1-C_5$, an alkenyl group, an aralkyl group or an aryl group, $R_{11}$ represents a sulfoalkyl group or $C_1-C_5$ or a carboxyalkyl group of $C_1-C_5$, $R_{12}$ represents an alkyl group of $C_1-C_5$, a substituent-containing alkyl group of $C_1-C_5$, an alkoxy group of $C_1-C_5$, nitro group, a halogen atom or hydrogen atom and $p_3$ represents 0 or 1).

15. A method according to claim 12, wherein the sensitizing dye has the following general formula (V):

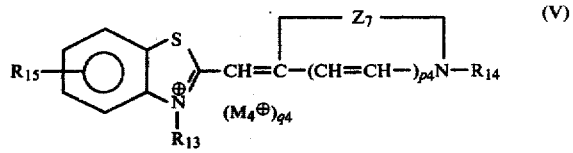

(wherein $Z_7$ represents a non-metal atom group necessary to complete a 5- or 6-membered nitrogen-containing heterocyclic ring nucleus, at least one of $R_{13}$ and $R_{14}$ represent a sulfoalkyl group of $C_1-C_5$ or a carboxyalkyl group of $C_1-C_5$ and the rest of $R_{13}$ and $R_{14}$ represents an alkyl group of $C_1-C_5$, a substituent-containing alkyl group of $C_1-C_5$, an aralkyl group, an aryl group or an alkenyl group, $R_{15}$ represents a nitro group, a halogen atom or hydrogen atom, $M_4$ represents an alkali metal atom or ammonium group and $p_4$ and $q_4$ represent 0 or 1).

16. An improved offset printing plate which comprises a support, a silver halide emulsion layer on the support comprising a fogged direct-positive silver halide emulsion which contains a desensitizing dye having a polarographic oxidation half-wave potential and a polarographic reduction half-wave potential which give a positive sum and at least one dye selected from the group consisting of betaine type cyanine sensitizing dyes and anion type cyanine sensitizing dyes and a surface layer containing nuclei for physical development on the emulsion layer, to which surface layer an image formed in said emulsion layer is transferred.

17. An improved offset printing plate according to claim 16 wherein the sensitizing dyes are at least one of those which have the following general formulas (I) and (II):

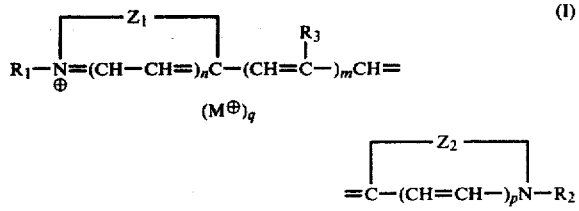

(wherein $Z_1$ and $Z_2$ represent non-metal atom groups necessary to complete 5- or 6-membered nitrogen-containing heterocyclic ring nuclei, at least one of $R_1$ and $R_2$ represents a sulfoalkyl group of $C_1-C_5$ or a carboxyalkyl group of $C_1-C_5$, and the rest represents an alkyl group of $C_1-C_5$, a substituent-containing alkyl group of $C_1-C_5$, an alkenyl group, an aralkyl group or an aryl group, $R_3$ represents an alkyl group of $C_1-C_5$ or hydrogen atom, $M$ represents an alkali metal atom or ammonium group and $n$, $m$, $p$ and $q$ represent 0 or 1), and

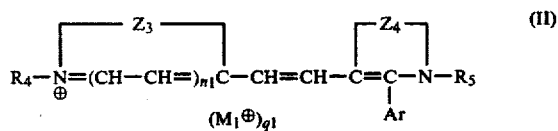

(wherein $Z_3$ and $Z_4$ represent non-metal atom groups necessary to complete 5- or 6-membered nitrogen-containing heterocyclic ring nuclei, $A_r$ represents an aryl group or a substituted aryl group, at least one of $R_4$ and $R_5$ represent a sulfoalkyl group of $C_1-C_5$ or a carboxyalkyl group of $C_1-C_5$ and the rest represents an alkyl group of $C_1-C_5$, a substituted-containing alkyl group, an alkenyl group, an aralkyl group or an aryl group, $M_1$ represents an alkali metal atom or ammonium group and $n_1$ and $q_1$ represent 0 or 1).

18. An improved offset printing plate according to claim 16 wherein the silver halide emulsion is silver iodobromide or silver chloroiodobromide emulsion containing at least 95 mol % of bromide.

19. An improved offset printing plate according to claim 16, wherein the sensitizing dye to a dye represented by the following general formula (III):

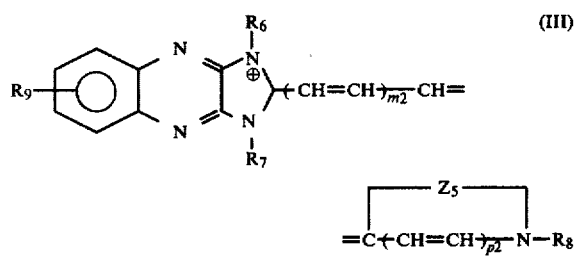

(wherein $Z_5$ represents a non-metal atom group necessary to complete a 5- or 6-membered nitrogen-containing ring nucleus, $R_6$ and $R_7$ represent an alkyl group of $C_1-C_5$, an aralkyl group or an aryl group, $R_8$ represents a sulfoalkyl group of $C_1-C_5$ or carboxyalkyl group of $C_1-C_5$, $R_9$ represents an alkyl group of $C_1-C_5$, a substituent-containing alkyl group of $C_1-C_5$, an alkoxy group of $C_1-C_5$, nitro group, a halogen atom or hydrogen atom and $m_2$ and $p_2$ represent 0 or 1).

20. An improved offset printing plate according to claim 16, wherein the sensitizing dye is a dye represented by the following general formula (IV):

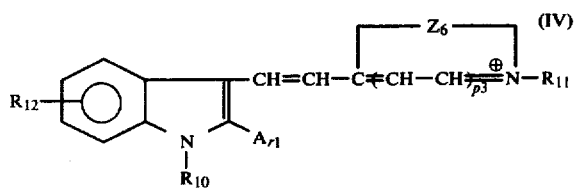

(wherein $Z_6$ represents a non-metal atom group necessary to complete a 5- or 6-membered nitrogen-containing heterocyclic ring nucleus, $A_{r1}$ represents an aryl group or a substituted aryl group, $R_{10}$ represents an alkyl group of $C_1-C_5$, an alkenyl group, an aralkyl group or an aryl group, $R_{11}$ represents a sulfoalkyl group of $C_1-C_5$ or a carboxyalkyl group of $C_1-C_5$, $R_{12}$ represents an alkyl group of $C_1-C_5$, a substituent-containing alkyl group of $C_1-C_5$, an alkoxy group of $C_1-C_5$, nitro group, a halogen atom or a hydrogen atom and $p_3$ represents 0 or 1).

21. An improved offset printing plate according to claim 16, wherein the sensitizing dye has the following general formula (V):

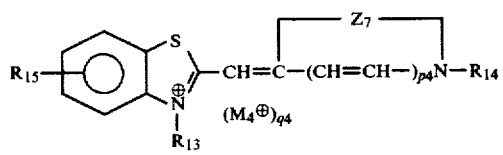

(wherein $Z_7$ represents a non-metal atom group necessary to complete a 5- or 6-membered nitrogen-containing heterocyclic ring nucleus, at least one of $R_{13}$ and $R_{14}$ represent a sulfoalkyl group of $C_1$–$C_5$ or a carboxyalkyl group of $C_1$–$C_5$ and the rest of $R_{13}$ and $R_{14}$ represents an alkyl group of $C_1$–$C_5$, a substituent-containing alkyl group of $C_1$–$C_5$, an aralkyl group, an aryl group or an alkenyl group, $R_{15}$ represents nitro group, a halogen atom or hydrogen atom, $M_4$ represents an alkali metal atom or ammonium group and $p_4$ and $q_4$ represents 0 or 1).

22. An improved offset printing plate according to claim 16 which consists of said support, said silver halide emulsion layer and said surface layer.

23. An improved offset printing plate which comprises a support, a silver halide emulsion layer on the support and containing at least one dye selected from the group consisting of betaine type cyanine sensitizing dyes and anion type cyanine sensitizing dyes and a surface layer containing nuclei for physical development on the emulsion layer, the surface of at least a part of said nuclei being naked and said surface layer being capable of forming thereon an oleophilic ink-receptive silver deposited from said silver halide emulsion layer by exposing and subsequently developing with silver complex diffusion transfer developer.

24. An improved offset printing plate according to claim 23 wherein the sensitizing dyes are at least one of those which have the following general formulas (I) and (II):

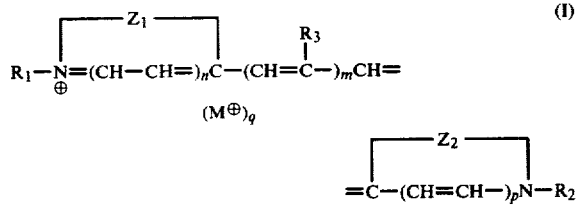

(wherein $Z_1$ and $Z_2$ represent non-metal atom groups necessary to complete 5- or 6-membered nitrogen-containing heterocyclic ring nuclei, at least one of $R_1$ and $R_2$ represents a sulfoalkyl group of $C_1$–$C_5$ or a carboxyalkyl group of $C_1$–$C_5$ and the rest represents an alkyl group of $C_1$–$C_5$, a substituent-containing alkyl group of $C_1$–$C_5$, an alkenyl group, an aralkyl group or an aryl group, $R_3$ represents an alkyl group of $C_1$–$C_5$ or hydrogen atom, M represents an alkali metal atom or ammonium group and n, m, p and q represent 0 or 1), and

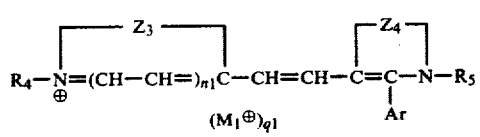

(wherein $Z_3$ and $Z_4$ represent non-metal atom groups necessary to complete 5- or 6-membered nitrogen-containing heterocyclic ring nuclei, $A_r$ represents an aryl group or a substituted aryl group, at least one of $R_4$ and $R_5$ represent a sulfoalkyl group of $C_1$–$C_5$ or a carboxyalkyl group of $C_1$–$C_5$, and the rest represents an alkyl group of $C_1$–$C_5$, a substituent-containing alkyl group, an alkenyl group, an aralkyl group or an aryl group, $M_1$ represents an alkali metal atom or ammonium group and $n_1$ and $q_1$ represent 0 or 1).

25. An improved offset printing plate according to claim 23, wherein the silver halide emulsion is silver iodobromide or silver chloroiodobromide emulsion containing at least 95 mol % of bromide.

26. An improved offset printing plate according to claim 23, wherein the silver halide emulsion is a fogged direct-positive silver halide emulsion which contains a desensitizing dye having a polarographic oxidation half-wave potential and a polarographic reduction half-wave potential which give a positive sum.

27. An improved offset printing plate according to claim 26, wherein the sensitizing dye is a dye represented by the following general formula (III):

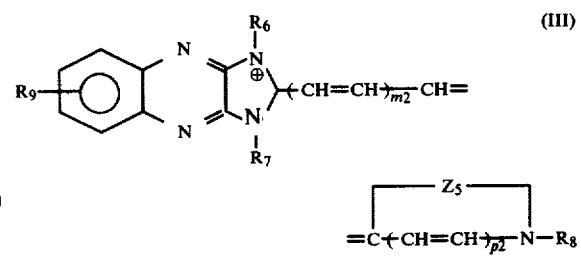

(wherein $Z_5$ represents a non-metal atom group necessary to complete a 5- or 6-membered nitrogen-containing ring nucleus, $R_6$ and $R_7$ represent an alkyl group of $C_1$–$C_5$, an aralkyl group or an aryl group, $R_8$ represents a sulfoalkyl group of $C_1$–$C_5$ or carboxyalkyl group of $C_1$–$C_5$, $R_9$ represents an alkyl group of $C_1$–$C_5$, a substituent-containing alkyl group of $C_1$–$C_5$, an alkoxy group of $C_1$–$C_5$, nitro group, a halogen atom or hydrogen atom and $m_2$ and $p_2$ represent 0 or 1).

28. An improved offset printing plate according to claim 26, wherein the sensitizing dye is a dye represented by the following general formula (IV):

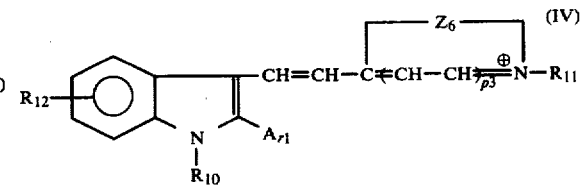

(wherein $Z_6$ represents a non-metal atom group necessary to complete a 5- or 6-membered nitrogen-containing heterocyclic ring nucleus, $A_{r1}$ represents an aryl group or a substituted aryl group, $R_{10}$ represents an alkyl group of $C_1$–$C_5$, an alkenyl group, an aralkyl group or an aryl group, $R_{11}$ represents a sulfoalkyl group of $C_1$–$C_5$ or a carboxyalkyl group of $C_1$–$C_5$, $R_{12}$ represents an alkyl group of $C_1$–$C_5$, a substituent-containing a alkyl group of $C_1$–$C_5$, an alkoxy group of $C_1$–$C_5$, nitro group, a halogen atom or a hydrogen atom and $p_3$ represents 0 or 1).

29. An improved offset printing plate according to claim 26, wherein the sensitizing dye has the following general formula (V):

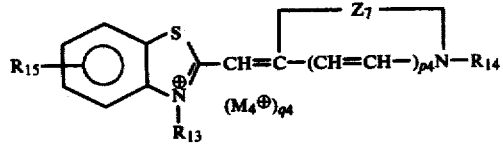

(V)

(wherein $Z_7$ represents a non-metal atom group necessary to complete a 5- or 6-membered nitrogen-containing heterocyclic ring nucleus, at least one of $R_{13}$ and $R_{14}$ represent a sulfoalkyl group of $C_1$–$C_5$ or a carboxyalkyl group of $C_1$–$C_5$ and the rest of $R_{13}$ and $R_{14}$ represents an alkyl group of $C_1$–$C_5$, a substituent-containing alkyl group of $C_1$–$C_5$, an aralkyl group, an aryl group or an alkenyl group, $R_{15}$ represents nitro group, a halogen atom or hydrogen atom, $M_4$ represents an alkali metal atom or ammonium group and $p_4$ and $q_4$ represent 0 or 1).

30. An improved offset printing plate according to claim 23 which consists of said support, said silver halide emulsion layer and said surface layer.

* * * * *